United States Patent [19]
Kobayashi

[11] Patent Number: 5,808,511
[45] Date of Patent: Sep. 15, 1998

[54] ACTIVE FEEDBACK PRE-DISTORTION LINEARIZATION

[75] Inventor: Kevin W. Kobayashi, Torrance, Calif.

[73] Assignee: TRW Inc., Redondo Beach, Calif.

[21] Appl. No.: 695,268

[22] Filed: Aug. 9, 1996

[51] Int. Cl.$^6$ ................................................. H03F 1/32
[52] U.S. Cl. ............................................................ 330/149
[58] Field of Search ........................... 330/149; 375/296, 375/297; 455/63

[56] References Cited

U.S. PATENT DOCUMENTS

| | | | |
|---|---|---|---|
| 4,465,980 | 8/1984 | Huang et al. | 330/149 |
| 4,532,477 | 7/1985 | Green, Jr. et al. | 330/149 |
| 5,038,113 | 8/1991 | Katz et al. | 330/277 |
| 5,079,517 | 1/1992 | Bader | 330/285 |
| 5,264,806 | 11/1993 | Kobayashi . | |

FOREIGN PATENT DOCUMENTS

| | | | |
|---|---|---|---|
| 0391235 | 3/1990 | European Pat. Off. . | |
| 391235 | 10/1990 | European Pat. Off. | 330/149 |
| 0451909 | 4/1991 | European Pat. Off. . | |
| 754646 | 8/1980 | U.S.S.R. | 330/149 |

OTHER PUBLICATIONS

H. Seidel, "A Feedforward Experiment Applied to an L–4 Carrier System Amplifier," *IEEE Transactions on Communication Technology,* vol. COM–19, No. 3, Jun. 1971, pp. 320–325.

A. Katz et al., "Passive FET MMIC Linearizers for C, X and Ku–Band Satillite Applications," *IEEE 1993 Microwave and Millimeter–Wave Monolithic Circuits Symposium,* pp. 155–158.

A. Katz et al., "A Reflective Diode Linearizer for Spacecraft Applications," *1985 IEEE MTT–S Digest,* pp. 661–664.

R. Inada et al., "A Compact 4–GHz Linearizer for Space Use," *IEEE Transactions on Microwave Theory and Techniques,* vol. MTT–34, No. 12, Dec. 1986, pp. 1327–1332.

*Primary Examiner*—James B. Mullins
*Attorney, Agent, or Firm*—Michael S. Yatsko

[57] ABSTRACT

A linear power amplifier utilizes active feedback pre-distortion linearization. The power amplifier is a two-stage amplifier which includes a pre-distortion active feedback driver amplifier and a power amplifier. The driver amplifier provides gain expansion and insertion phase decrease as input power is increased, which compensates for the output power amplifier's gain compression and insertion phase increase with input power, resulting in a two-stage amplifier with relatively higher linear power output power capability and associated power-added efficiency. The two-stage linear power amplifier in accordance with the present invention provides improved linear efficiency which can be mass-produced in high volume with excellent repeatability. A voltage bias circuit with an external voltage post enables the two-stage amplifier to be tuned with an external voltage for optimum performance.

32 Claims, 11 Drawing Sheets

ACTIVE FEEDBACK PRE-DISTORTION LINEARIZATION

BACKGROUND OF THE INVENTION

1. Field of the Invention

The present invention relates to a monolithic linear power amplifier, and more particularly, to a two-stage monolithic linear power amplifier which includes a pre-distortion active feedback driver amplifier and an output power amplifier which incorporates active feedback in the driver amplifier to pre-distort and amplify incoming RF signals to create amplitude and phase characteristics which compensate for the amplitude and phase characteristics of the output power amplifier stage in order to extend the linear output characteristics of the combined two-stage amplifier.

2. Description of the Prior Art

Increasing the efficiency of linear power amplifiers is key to reducing the cost, weight, size and integration complexity for various communications systems, including transmitters for satellite and terrestrial communications systems. Linear amplification is also required for communications which use non-constant envelope modulation schemes, wherein the amplitude and phase characteristics of the transmitted signal must be preserved. Examples of such systems requiring linear power transmission are: phased array, satellite downlinks, and terrestrial wireless communications, such as cellular and cordless telephones. In such systems, the higher the linear efficiency, the fewer amplifier cells need to be combined in a power amplifier stage, matrix or array, also resulting in reduced DC converter peripheral hardware and harnessing. By limiting the number of amplifier cells, the overall size, weight and integration complexity of the amplifier for such applications will be reduced, which results in lower overall cost and higher performance. Such reduced size and weight is particularly desirable in certain applications, such as satellites communications systems where the weight of the spacecraft is critical. Improved efficiency linear power amplifiers are also beneficial in terrestrial communications systems, such as cellular and cordless telephone systems, wherein the improved amplifier efficiency results in improved battery life.

As mentioned above, for non-constant envelope-modulated communications systems, preserving the amplitude and phase characteristics of the transmitted information is crucial to system performance. As such, such systems normally require power amplifiers which employ circuitry to back off input power until the amplifier is in a region of linear operation. Such systems are known to use a power amplifier output detector and a variable gain amplifier in a controlled loop. However, there are tradeoffs to backing off the compression in order to improve the linearity of an amplifier, such as reducing the amplifier's power-added efficiency (PAE). Conventionally, linear power efficiencies of about 20 to 25 percent are typical at a few decibels backed off of compression, which is relatively poor efficiency performance with respect to the power amplifier's saturated power-added efficiency, known to range from about 35 percent to as high as 80 percent. Unfortunately, for non-constant envelope modulation systems, the power amplifier must be operated in the linear region and backed off of compression, making the efficiency even worse.

Several techniques are known for improving the linear power efficiency of amplifiers, such as feedforward linearization and pre-distortion techniques. Such techniques are disclosed in "A Feedforward Experiment Applied to an L-4 Carrier System Amplifier", by H. Seidel, *IEEE Transactions on Communication Technology*, Vol. COM-19, No. 3, June 1971, pp. 320–325; "Passive FET MMIC Linearizers for C, X and Ku- Band Satellite Applications", by A. Katz, S. Moochalla, and J. Klatskin, 1993 IEEE MMWMC Symp. Dig., Atlanta, Ga., pp. 155–158; "A Reflective Diode Linearizer for Spacecraft Applications", by A. Katz, R. Sudarsanam and D. Aubert, 1985 IEEE MTT Symp. Dig., St. Louis, Mo., pp. 661–664; "A Compact 4-GHz Linearizer for Space Use", by R. Inada, H. Ogawa, S. Kitazume and P. Desantis, *IEEE Transactions on MTT*, Vol. MTT-34, No. 12, December 1986, pp. 1327–1332; and U.S. Pat. No. 5,264,806. Unfortunately, such techniques involve relatively complicated methods or systems which require additional hardware, are not economically feasible in a high-volume production environment, or are very sensitive and require precise tuning. Moreover, many of these known techniques are not practical to implement in portable handset applications where low cost and small size are critical and little or no performance tuning of the part is allowed.

SUMMARY OF THE INVENTION

It is an object of the present invention to provide a linear power amplifier that solves various problems in the prior art.

It is yet another object of the present invention to provide a linear power amplifier with increased efficiency.

Briefly, the present invention relates to a linear power amplifier which utilizes active feedback pre-distortion linearization. The linear power amplifier is implemented as a two-stage amplifier with a pre-distortion active feedback driver amplifier and a power amplifier. The driver amplifier provides gain expansion and insertion phase decrease as input power is increased, which compensates for the output power amplifier's gain compression and insertion phase increase with input power, resulting in a two-stage amplifier with relatively higher linear power output power capability and associated power-added efficiency. A circuit with an external voltage bias part enables the two-stage amplifier to be tuned with an external voltage for optimum performance.

BRIEF DESCRIPTION OF THE DRAWING

These and other objects of the present invention will be readily understood with reference to the following specification and attached drawing, wherein.

DETAILED DESCRIPTION OF THE INVENTION

Figure 1:
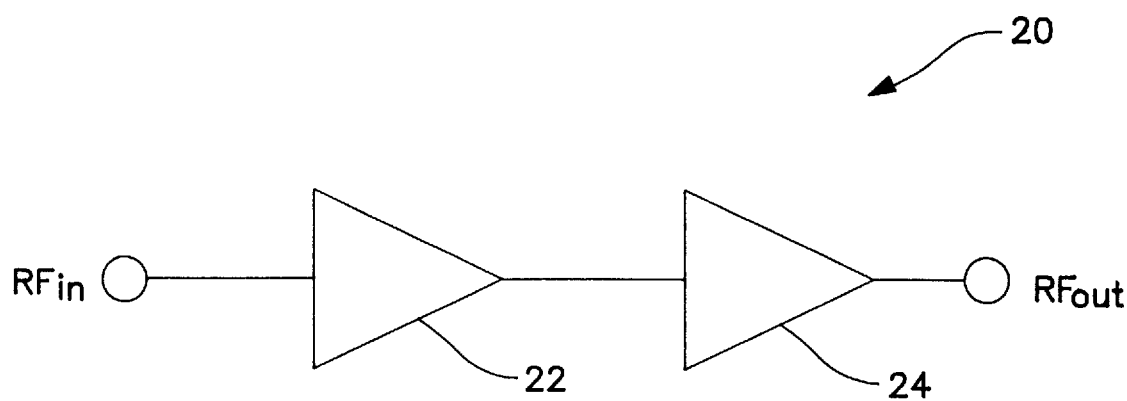
FIG. 1 is a block diagram of a linearized two-stage power amplifier in accordance with the present invention.

The power amplifier in accordance with the present invention is shown in simplified block diagram form in FIG. 1 and generally identified with the reference numeral 20. The linearized power amplifier 20 includes a pre-distortion active feedback driver amplifier 22 and a power amplifier 24, both with input and output terminals. The improved efficiency of the two-stage linearized power amplifier 20 is achieved by utilizing active feedback in the pre-distortion active feedback driver amplifier 22, which pre-distorts and amplifies the incoming RF signal $RF_{in}$, which, in turn, is fed into the power amplifier 24. The pre-distortion active feedback driver amplifier 22 manipulates the amplitude and phase characteristics of the input RF signal $RF_{in}$ to compensate for the amplitude and phase characteristics of the output power amplifier stage 24 in order to extend the linear output characteristics of the combined two-stage amplifier 20. For example, the driver amplifier 22 may be configured to have gain expansion and insertion phase decrease characteristics as the input power is increased, in order to compensate for the output power amplifier 24 having a characteristic of gain compression and insertion phase increase with input power, to provide a relatively higher linear output power capability and associated power-added efficiency.

As will be discussed in more detail below, active feedback is integrated into the driver amplifier 22 to achieve the pre-distortion pre-amp characteristics discussed above and provides several advantages over the relatively more complex pre-distortion circuits and linearization techniques known in the art. For example, the active feedback technique, in accordance with the present invention can be monolithically integrated without substantially increasing the chip size. Moreover, the two-stage linearized power amplifier 20 in accordance with the present invention incorporates RF feedback, which makes the topology inherently more stable, is easily self-biased, and can be electronically tuned in order to obtain optimum efficiency performance and can operate from low voltage supplies (i.e., 2 to 3 $V_{bc}$ diode drops) to accommodate battery operated portable units.

Figure 2:
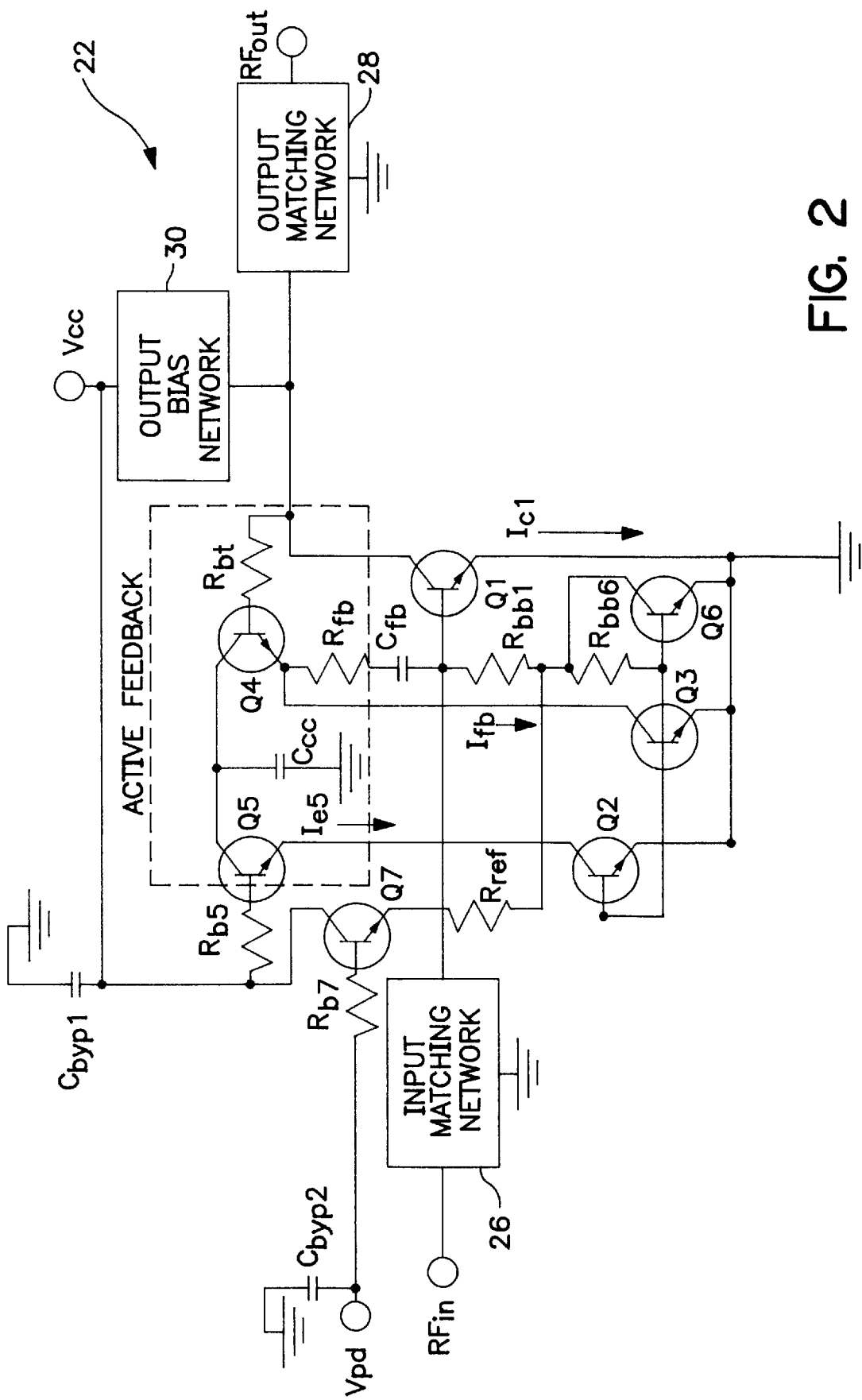
FIG. 2 is a schematic diagram of the pre-distortion active feedback driver amplifier of the linearized two-stage amplifier in accordance with the present invention.

A schematic diagram of the pre-distortion active feedback driver amplifier 22 is illustrated in FIG. 2. The pre-distortion active feedback driver amplifier 22 includes a bipolar transistor $Q_1$ with input and output matching networks 26 and 28 for input and output impedance matching, respectively, as well as an output bias network 30. The input matching network 26, output matching network 28, and output bias network 30 are well within the ordinary skill in the art. The RF signal $RF_{in}$ is applied to the base of the bipolar power transistor $Q_1$ by way of the input matching network 26. The base of the bipolar power transistor $Q_1$ is biased by way of a current mirror which includes a plurality of resistors $R_{bb1}$, $R_{bb6}$, and $R_{ref}$, as well as a transistor $Q_6$. The transistor $Q_6$ is driven by a power-down emitter follower circuit, which includes a transistor $Q_7$ and a base resistor $R_{b7}$. The power-down emitter follower circuit is controlled by a voltage source $V_{pd}$. A pair of bypass capacitors $C_{byp1}$ and $C_{byp2}$ are utilized on the DC supplies $V_{pd}$ and $V_{cc}$ to filter high-frequency noise.

An active feedback loop is provided by an active feedback transistor $Q_4$, whose base is coupled to the collector of the power transistor $Q_1$ by way of a base tuning resistor $R_{br}$. The emitter of the active feedback transistor $Q_4$, in turn, is coupled to the base of the power transistor $Q_1$ by way of a series R-C network, which includes a resistor $R_{fb}$ and a capacitor $C_{fb}$. The value of the resistor $R_{fb}$ and capacitor $C_{fb}$ as well as the base tuning resistor $R_{br}$ of the active feedback transistor $Q_4$, set the RF feedback of the driver amplifier 22.

An emitter current bias for the active feedback transistor $Q_4$ is provided by a current source which includes a transistor $Q_3$, which mirrors current from the transistor $Q_1$ base bias current mirror circuit, which includes a transistor $Q_6$ and a resistor $R_{bb6}$. The collector current of the active feedback transistor is biased by way of a second feedback loop which includes a biasing transistor $Q_5$. In particular, the collector of the active feedback transistor $Q_4$ is directly connected to the collector of a transistor $Q_5$ for providing bias to the active feedback transistor $Q_4$, as well as providing low frequency RF loading. The base of the transistor $Q_5$ is connected to the power supply $V_{cc}$ by way of a base resistor $R_{b5}$. A current source which includes a transistor $Q_2$ sets the bias current $I_{c5}$ of the transistor $Q_5$. A compensation capacitor $C_{cc}$, coupled to the collectors of the transistors $Q_4$ and $Q_5$, provides low-pass filtering. The value of the compensation capacitor $C_{cc}$ is chosen for optimum pre-distortion characteristics.

In operation, the transistors $Q_4$ and $Q_5$ are biased in or near saturation. In particular, if $Q_4$ is operating in saturation where its base-collector junction is strongly forward biased, the other transistor, $Q_5$, will be operating in the forward active region near saturation but with its collector-base junction lightly forward biased. The pre-distortion characteristics rely on a degree of saturated bias of the active feedback transistor $Q_4$, the value of the compensation capacitor $C_{cc}$ as well as the DC coupling of the collector-connected transistors $Q_4$ and $Q_5$.

Figure 3A:
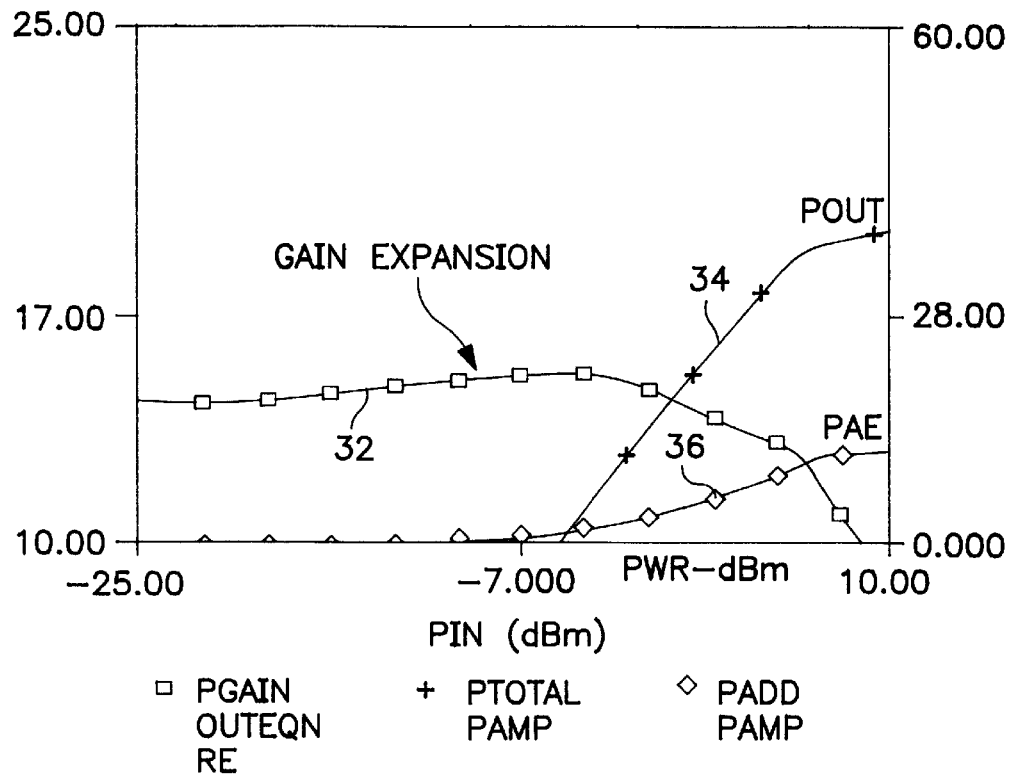
FIG. 3A is a graphical illustration of the gain, output power $P_{OUT}$ and power-added efficiency (PAE), as a function of the input power $P_{IN}$ of the pre-distortion active feedback driver amplifier in accordance with the present invention.

FIG. 3A is a graphical illustration of the gain, output power $P_{OUT}$ and power-added efficiency (PAE) of the pre-distortion active feedback driver amplifier 22 illustrated in FIG. 2 as a function of the input power of the RF signal $RF_{in}$. Referring to FIG. 3A, curve 32 represents the gain of the pre-distortion active feedback driver amplifier 22 as a function of the input power of the RF signal $RF_{in}$. The curve 34 represents the output power $P_{OUT}$ of the pre-distortion active feedback driver amplifier 22 as a function of the input power $P_{in}$, while the curve 36 represents the power-added efficiency (PAE) of the pre-distortion active feedback driver amplifier 22 as a function of the input power. Referring to the curve 32 in FIG. 3A, for increasing input power $P_{in}$, the gain of the pre-distortion active feedback driver amplifier 22 increases and then rolls off at relatively high values of the input power $P_{in}$ of the RF signal $RF_{in}$. As illustrated in the curves 34 and 36, the output power $P_{OUT}$, as well as the power-added efficiency (PAE), increases with increasing input power $P_{in}$ and saturates at relatively high power levels.

Figure 3B:
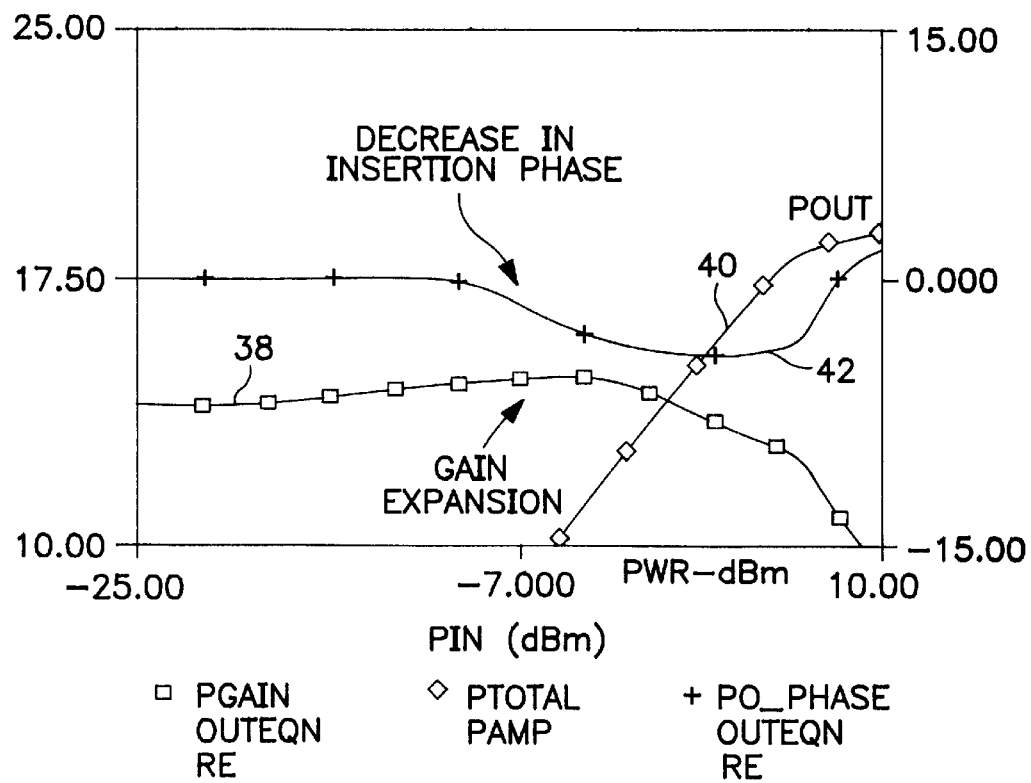
FIG. 3B is a graphical illustration of the gain, output power $P_{OUT}$ and normalized insertion phase as a function of the input power $P_{IN}$ of the pre-distortion active feedback driver amplifier in accordance with the present invention.

FIG. 3B is a graphical illustration of the gain, output power $P_{OUT}$ and normalized insertion phase of the pre-distortion active feedback driver amplifier 22 as a function of the input power $P_{in}$. The curve 38 represents the gain of the pre-distortion active feedback driver amplifier 22 as a function of the input power. The curve 40 represents the output power of the pre-distortion active feedback driver amplifier 22 as a function of the input power $P_{in}$ of the RF input signal $RF_{in}$. The curves 38 and 40 are similar to the curves 32 and 34 illustrated in FIG. 3A. The curve 42 represents the normalized insertion phase of the pre-distortion active feedback driver amplifier 22 as a function of the input power $P_{in}$. Referring to the curve 42, there is an input power region where the insertion phase of the pre-distortion active feedback driver amplifier 22 decreases with increasing levels of the input power $P_{in}$ and subsequently increases with increasing input power levels $P_{in}$ and begins to ramp back up at relatively higher power levels. As will be discussed in more detail below, the gain expansion and increasing insertion phase characteristics of the pre-distortion active feedback driver amplifier 22 act to compensate the output amplifier 24 gain compression characteristics.

Figure 4:
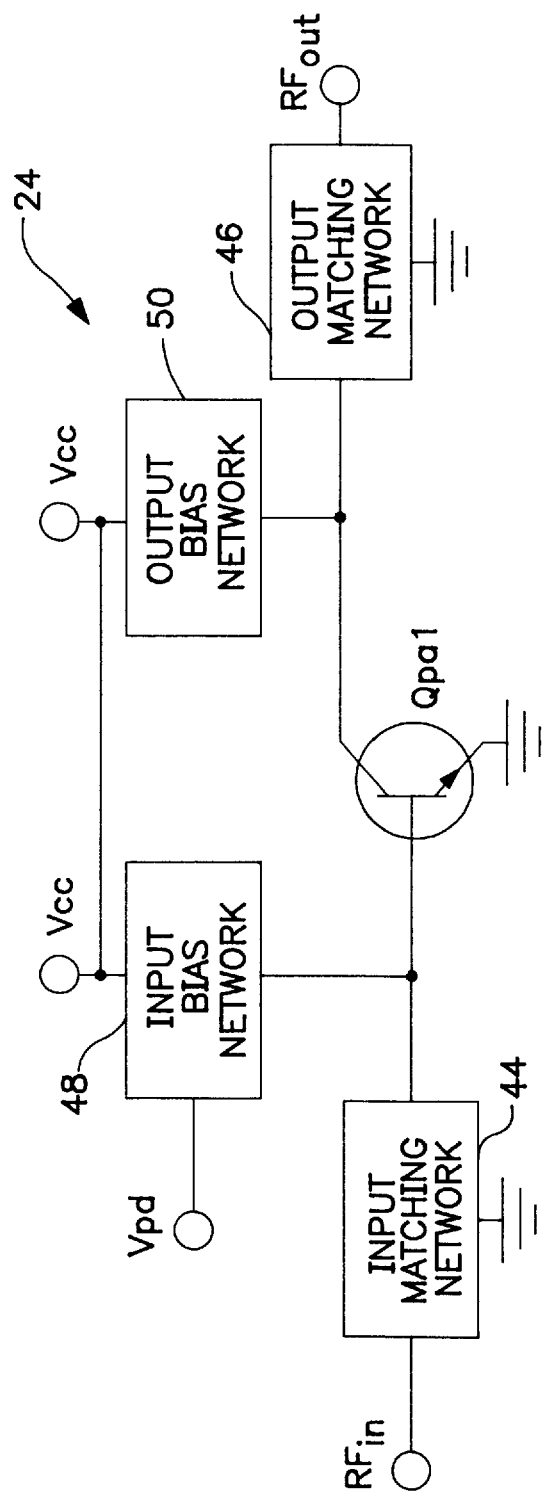
FIG. 4 is a schematic diagram of the output power amplifier portion of the linearized two-stage power amplifier in accordance with the present invention.

FIG. 4 is a schematic diagram of a typical output power amplifier 24 suitable for use with the present invention, which includes a power transistor $Q_{PA1}$. The output of the pre-distortion active feedback driver amplifier 22 (FIG. 2) is coupled to the power amplifier 24 by way of an input matching network 44. In particular, the RF output from the output matching network 28 (FIG. 2) is directly coupled to the RF input terminal of the power amplifier 24. The RF input terminal $R_{in}$ of the power amplifier 24, in turn, is connected to the input matching network 44 which, in turn, is connected to the base of the power transistor $Q_{PA1}$. The output $RF_{out}$ of the power amplifier 24 is available at the emitter of the power transistor $Q_{PA1}$ by way of a serially coupled output matching network 46. An input bias network 48, as well as an output bias network 50, are connected at the base and collector of the power transistor $Q_{PA1}$. A power-down control voltage $V_{pd}$ is applied to the input bias network 48, typical of various known wireless portable handset systems. The input matching network 44, as well as the matching network 46, are utilized to optimize the performance of the power amplifier 24. These matching networks 44 and 46 are used to match the impedance of the circuits to which they are connected to optimize performance. For example, the input matching network 44 is configured to match the output impedance of the pre-distortion active feedback driver amplifier 22. The output matching network 46 is configured to match the input impedance of the circuit to which the power amplifier 24 is to be connected. The input bias network 48, as well as the output bias network 50, are used to bias the power transistor $Q_{PA1}$ and force it to operate in its linear range. The input matching network 44, output matching network 46, input bias network 48, as well as the output bias network 50, are well within the ordinary skill of the art.

Figure 5A:
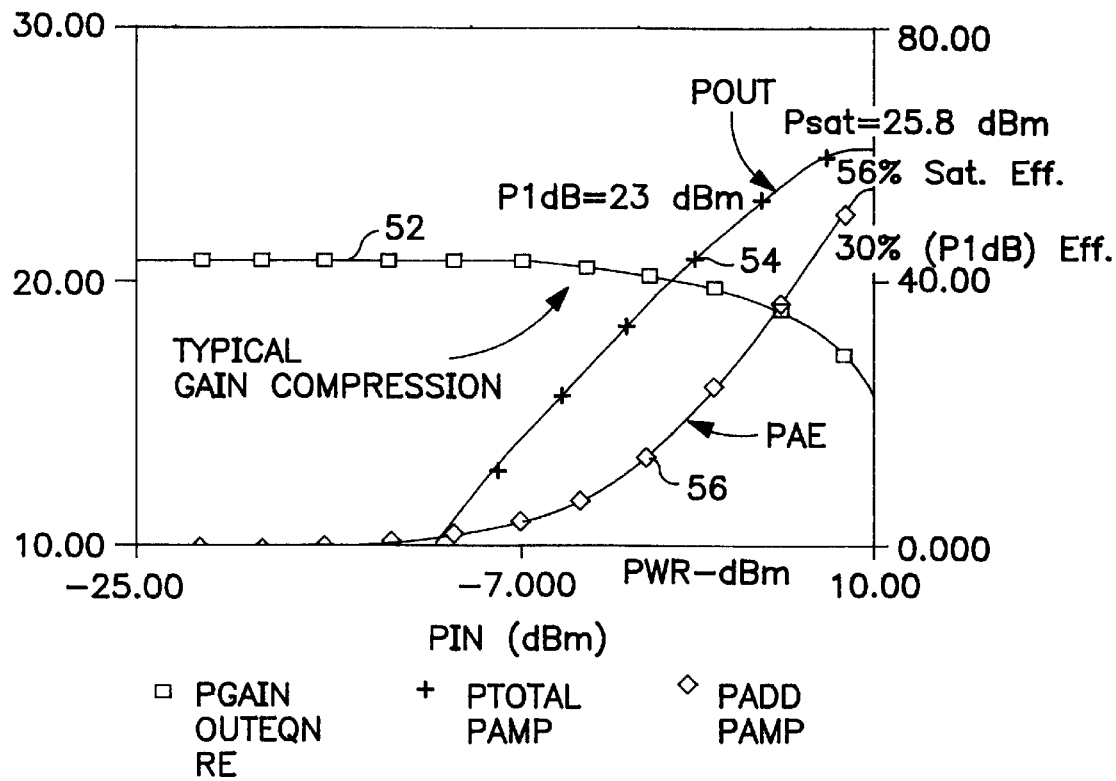
FIG. 5A is a graphical illustration of the gain, output power $P_{OUT}$ and power-added efficiency (PAE) as a function of the input power $P_{IN}$ of the output power amplifier stage.

FIG. 5A is a graphical illustration of the gain, output power $P_{out}$ and power-added efficiency (PAE) of the power amplifier 24 as a function of the input power (i.e., output of the pre-distortion active feedback driver amplifier 22). The curve 52 represents the gain of the power amplifier 24 as a function of the input power $P_{in}$. As shown in FIG. 5A, the gain compresses for increasing levels of the input power $P_{in}$ which, as mentioned above, is compensated by the gain characteristics of the pre-distortion active feedback driver amplifier 22 whose gain increases with increasing levels of the input power $P_{in}$. The curves 54 and 56 illustrate that the output power $P_{out}$, as well as the power-added efficiency (PAE) of the power amplifier 24 increase with increasing levels of the input power $P_{in}$ and saturate at relatively high levels of the input power $P_{in}$.

Figure 5B:
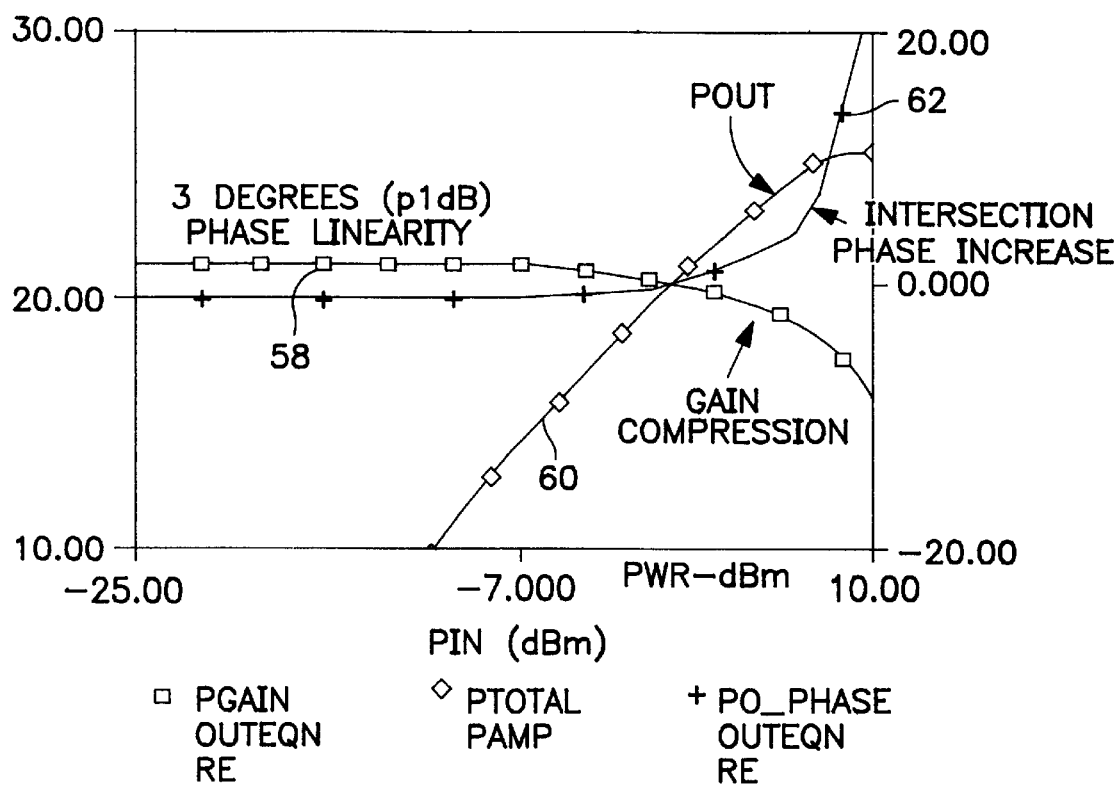
FIG. 5B is a graphical illustration of the gain, output power $P_{OUT}$ and normalized insertion phase as a function of the input power $P_{IN}$ of the output power amplifier stage.

FIG. 5B is a graphical illustration of the gain, output power $P_{out}$ and insertion phase of the power amplifier 24 as a function of the input power $P_{in}$ for the power amplifier 24. The curves 58 and 60 represent the gain, as well as the output power $P_{out}$, of the power amplifier 24 and are similar to the curves 52 and 54 illustrated in FIG. 5A. The curve 62 represents the insertion phase of the power amplifier 24 as a function of the input power $P_{in}$. FIG. 5B illustrates that as the power amplifier 24 goes into compression, the insertion phase quickly ramps up and becomes non-linear with increasing levels of the input power $P_{in}$. For example, at 1 dB of compression, the output power ($P_{1dB}$) is 23 dBm, with an associated efficiency of 30 percent and an insertion phase of +3°. The 1 dB compression figure represents the upper limit of the linear power amplification just before the power amplifier 24 goes into saturation.

Figure 6A:
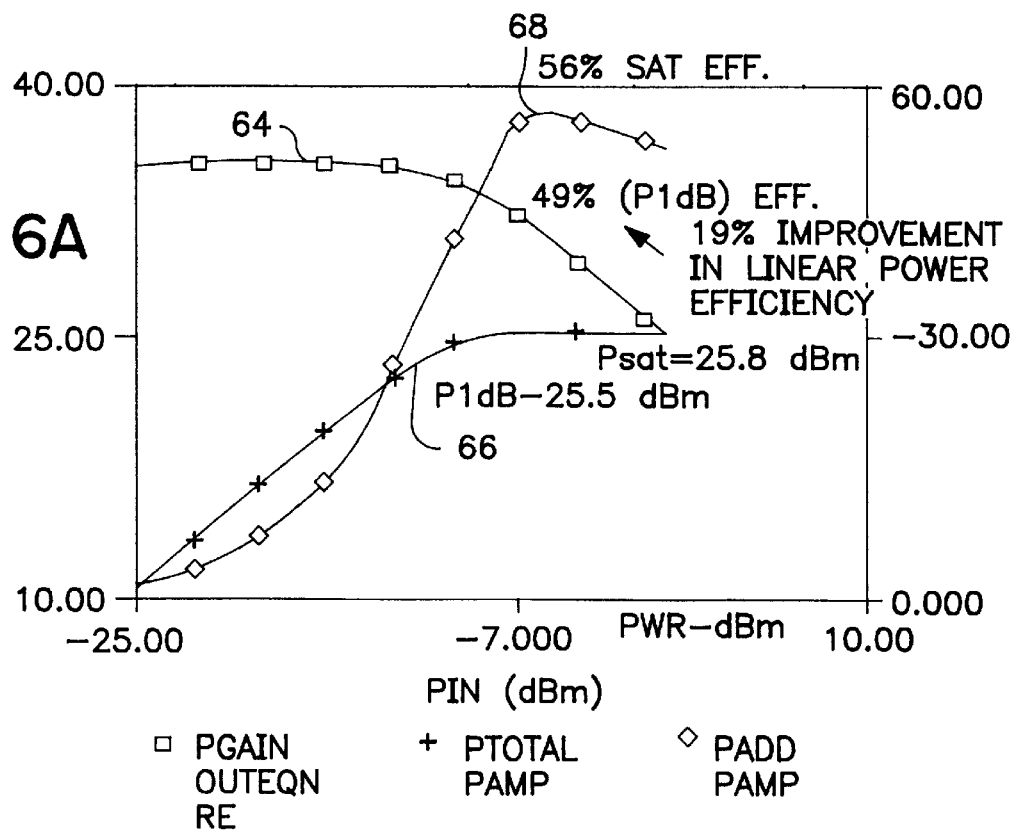
FIG. 6A is a graphical illustration of the gain, output power $P_{OUT}$, as well as the power-added efficiency (PAE) as a function of the input power $P_{IN}$ of the linearized two-stage power amplifier in accordance with the present invention.
Figure 6B:
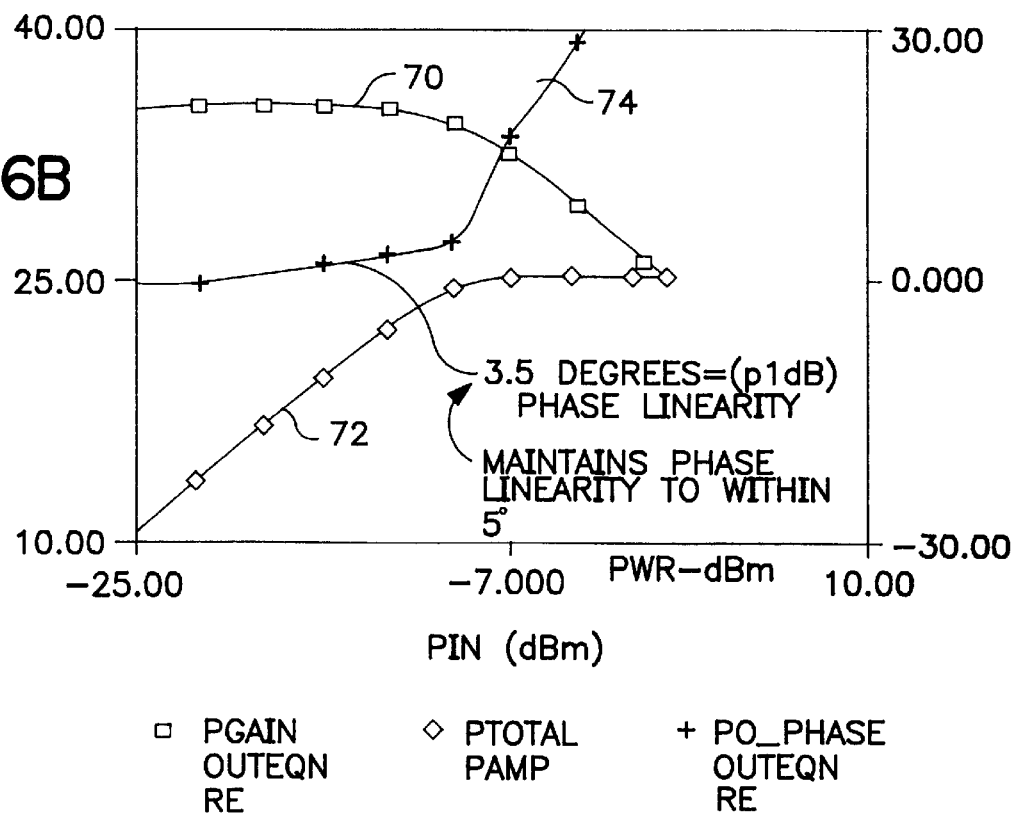
FIG. 6B is a graphical illustration of the gain, output power $P_{OUT}$, and normalized insertion phase as a function of the input power $P_{IN}$ of the linearized two-stage power amplifier in accordance with the present invention.

FIGS. 6A and 6B are graphical representations illustrating the combined performance of the pre-distortion active feedback driver amplifier 22, as well as the power amplifier 24 (i.e., two-stage power amplifier 20). FIG. 6A is a graphical illustration of the gain, output power $P_{out}$, as well as power-added efficiency (PAE) of the combined two-stage linearized power amplifier 20. The curve 64 represents the gain, while the curve 66 represents the output power $P_{out}$, of the two-stage linearized power amplifier 20 as a function of the input power $P_{in}$. The curve 68 represents the power-added efficiency (PAE) of the combined two-stage linearized power amplifier 20 as a function of the input power $P_{in}$. At 1 dB of compression ($P_{1dB}$), FIG. 6 illustrates an efficiency of about 49 percent. Referring back to FIG. 5A, at 1 dB of compression ($P_{1dB}$), the efficiency of the power amplifier 24 by itself was only 30 percent. As such, it is clear from FIG. 6A that the combined two-stage linearized power amplifier 20 at 1 dB of compression, is a 19 percent improvement in power-added efficiency (PAE).

FIG. 6B is a graphical illustration of the gain, output power $P_{out}$, and normalized insertion phase as a function of the input power $P_{in}$ of the two-stage linearized power amplifier 20, in accordance with the present invention. The curve 70 represents the gain, while the curve 72 represents the output power of the two-stage linearized power amplifier 20 as a function of the input power $P_{in}$. The curves 70 and 72 are similar to the curves 64 and 66, respectively, in FIG. 6A. The curve 74 represents the normalized insertion phase of the two-stage linearized power amplifier 20 as a function of the input power $P_{in}$. Referring to the curve 74 in FIG. 6B, the two-stage linearized power amplifier 20 is able to maintain phase linearity within 50 at the 1 dB compression point ($P_{1dB}$).

Figure 7:
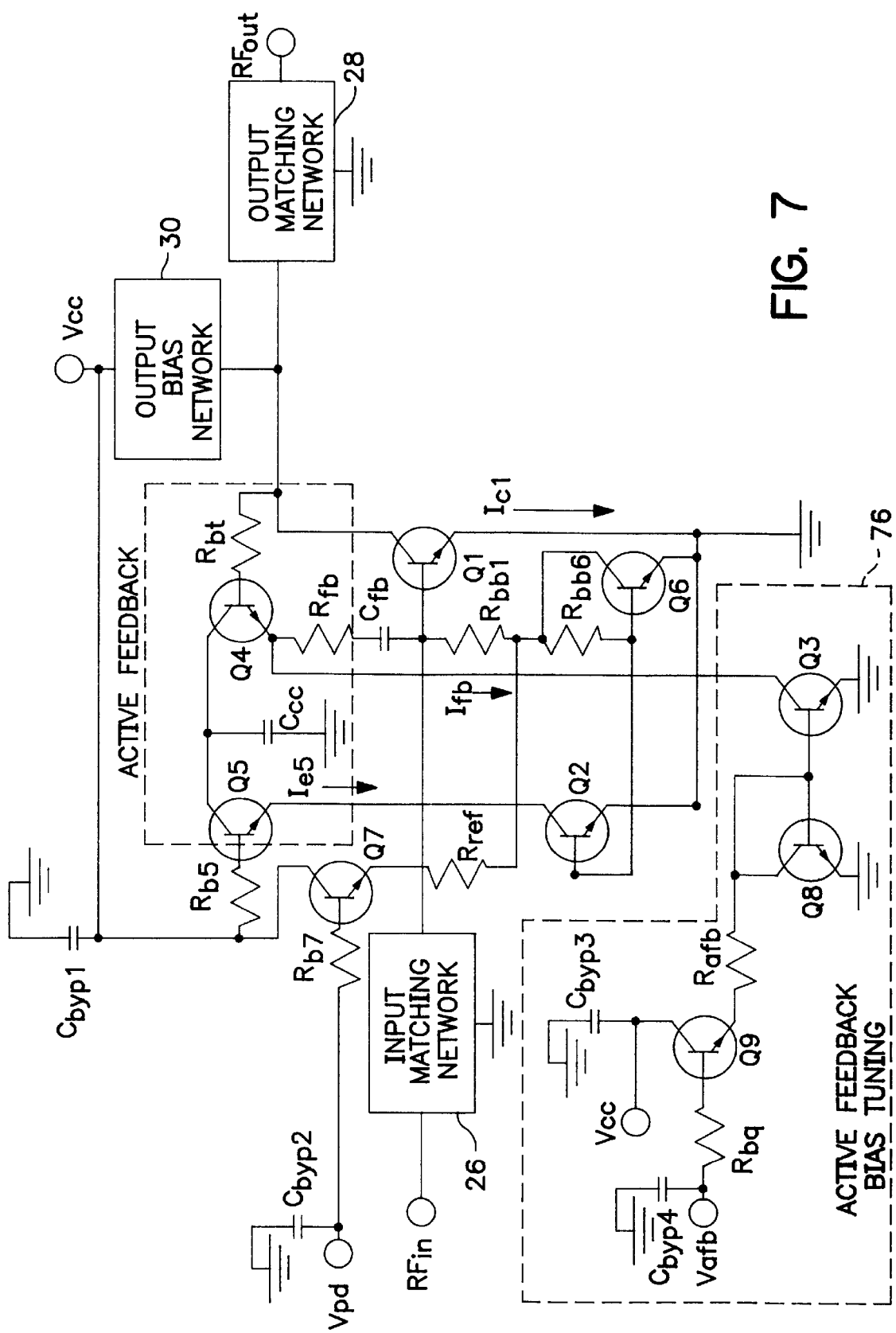
FIG. 7 is a schematic diagram of an alternate embodiment of the pre-distortion active feedback driver amplifier with a tuning bias circuit coupled to its active feedback transistor.
Figure 8:
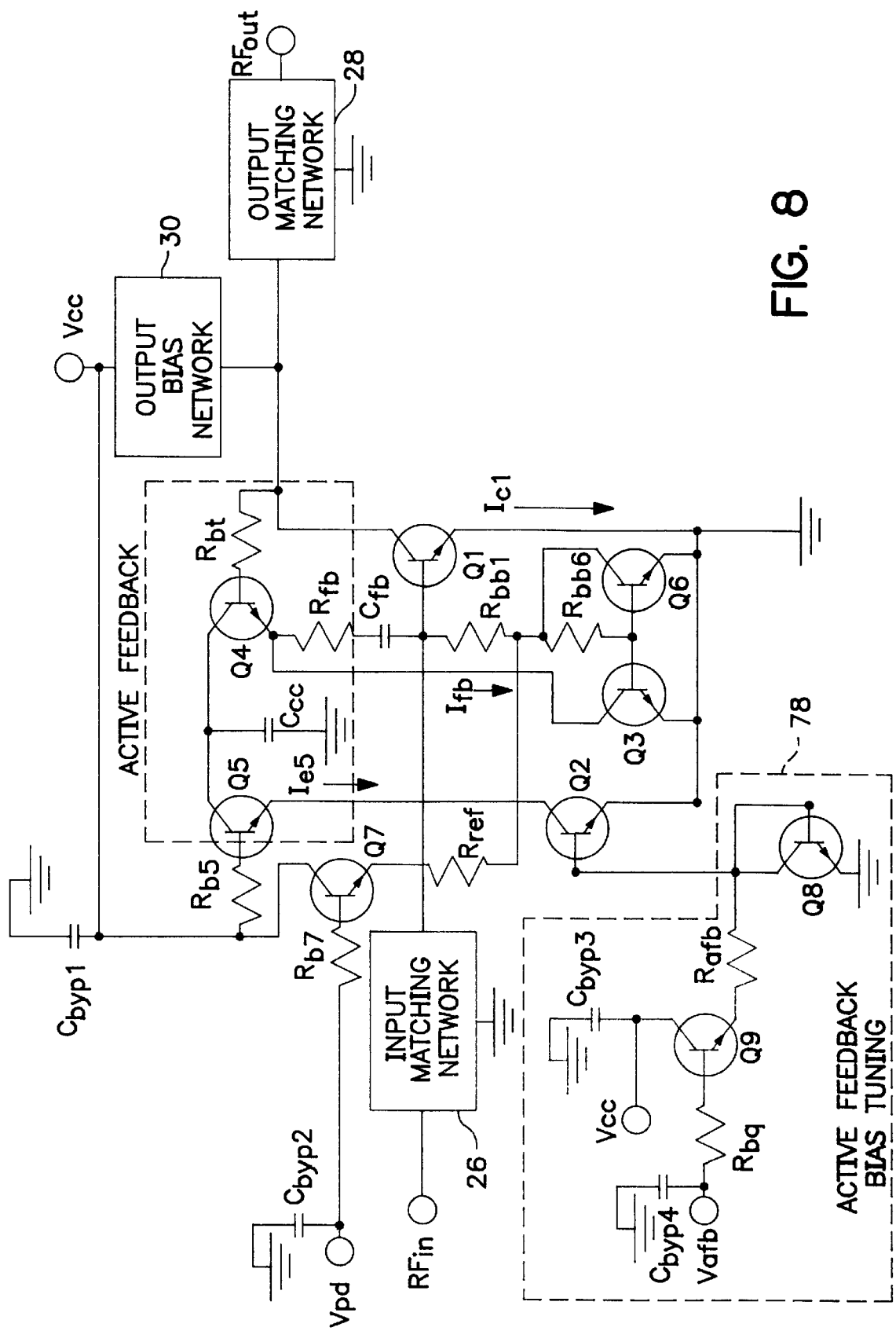
FIG. 8 is another alternate embodiment of the pre-distortion active feedback driver amplifier with a tuning bias circuit coupled to its balanced collector-coupled transistor.

Another important aspect of the invention is illustrated in FIGS. 7 and 8. In these embodiments, a pre-distortion active feedback driver amplifier 22 is provided with a voltage-controlled current source at the emitter of the transistors $Q_5$ or $Q_4$, which can be adjusted for optimum power efficiency performance when combined with the power amplifier stage 24 to control the bias characteristics of the active feedback transistors $Q_4$ and $Q_5$. With the exception of the active feedback bias tuning circuits, the balance of the schematic diagram for the pre-distortion active feedback driver amplifier 22 is essentially the same as illustrated in FIG. 2. As such, like components are identified with like reference numerals and are not discussed further.

Referring to FIG. 7, the pre-distortion active feedback driver amplifier 22 is provided with an active feedback bias tuning circuit 76, shown within the dashed box 76. The active feedback bias tuning circuit 76 is implemented as a current source, current mirror coupled to the emitter of the feedback transistor $Q_4$ in order to enable the active feedback bias current $I_{fb}$ to be tuned, as well as its associated pre-distortion characteristics. The active feedback bias tuning circuit 76 includes a pair of current mirror transistors $Q_3$ and $Q_8$, and a reference resistor $R_{afb}$, used to set the bias current $I_{fb}$ and an emitter follower transistor $Q_9$. The emitter follower transistor $Q_9$ is coupled to an active feedback bias control voltage $V_{afb}$ (i.e., tuning voltage) by way of the base resistor $R_{b9}$. The collector of the emitter follower transistor $Q_9$ is coupled to the supply voltage $V_{cc}$ and bypassed with a bypass capacitor $C_{byp3}$. The supply voltage $V_{afb}$ is likewise bypassed with a capacitor $C_{byp4}$. The bypass capacitors $C_{byp3}$ and $C_{byp4}$ provide filtering. As will be discussed below, varying the active feedback bias voltage $V_{afb}$, the feedback bias current $I_{fb}$ is adjusted which, in turn, adjusts the pre-distortion active feedback transistor $Q_4$.

FIG. 8 is an altering embodiment of the pre-distortion active feedback driver amplifier 22, with a different active feedback bias tuning circuit, shown within the dashed box 78. In this embodiment, the active feedback bias tuning circuit 78 is implemented as a current source bias for the transistor $Q_5$. In this embodiment, the active feedback bias tuning circuit 78 is implemented as a current source, current mirror coupled to the emitter of the transistor $Q_5$. The active feedback bias tuning circuit 78 includes a mirror transistor $Q_8$, a reference resistor $R_{afb}$, which sets the current bias $I_{c5}$ of the transistor $Q_5$. The active feedback bias tuning circuit 78 also includes an emitter follower transistor $Q_9$ that is coupled to an active feedback bias control voltage $V_{afb}$ by way of base resistor $R_{b9}$. The collector of the emitter follower transistor $Q_9$ coupled to the power supply voltage $V_{cc}$ and bypassed with a bypass resistor $C_{byp3}$. The active feedback bias control voltage $V_{afb}$ is similarly bypassed with a bypass capacitor $C_{byp4}$.

In this embodiment, varying the active feedback bias tuning voltage $V_{afb}$ varies the current $I_{c5}$ through the emitter of the transistor $Q_9$, which can be adjusted to change the DC bias and impact the pre-distortion characteristics of the active feedback transistor $Q_4$. More particularly, as the active feedback bias tuning voltage $V_{afb}$ is increased, the current $I_{c5}$ through the emitter of the transistor $Q_5$ is increased, which forces the base collector junction of the feedback transistor $Q_4$ to become more forward-biased, which biases the feedback transistor $Q_4$ more deeply into saturation, and thus changes the pre-distortion characteristics of the pre-distortion active feedback driver amplifier 22.

Figure 9A:
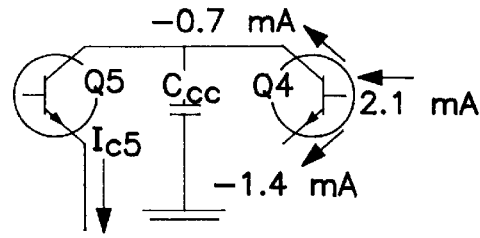
FIG. 9A is a simplified schematic diagram of the circuit illustrated in FIG. 8 for a relatively high tuning voltage $V_{afb}$.
Figure 9B:
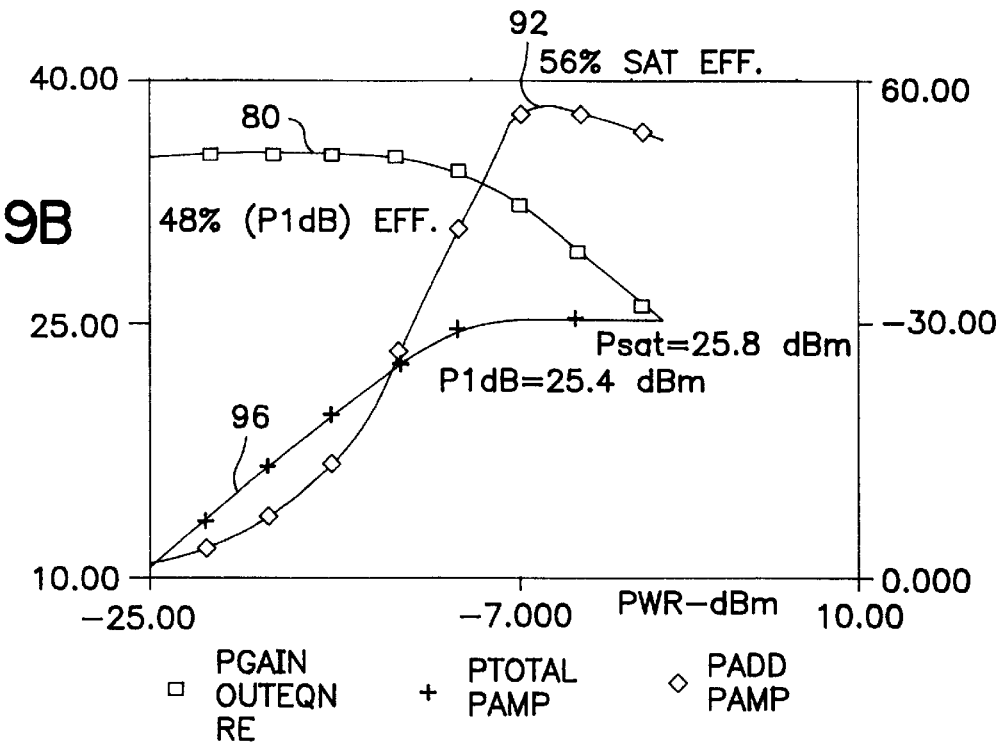
FIG. 9B is a graphical illustration of the gain, output power $P_{OUT}$ and power-added efficiency (PAE) of the circuit illustrated in FIG. 9A.
Figure 9C:
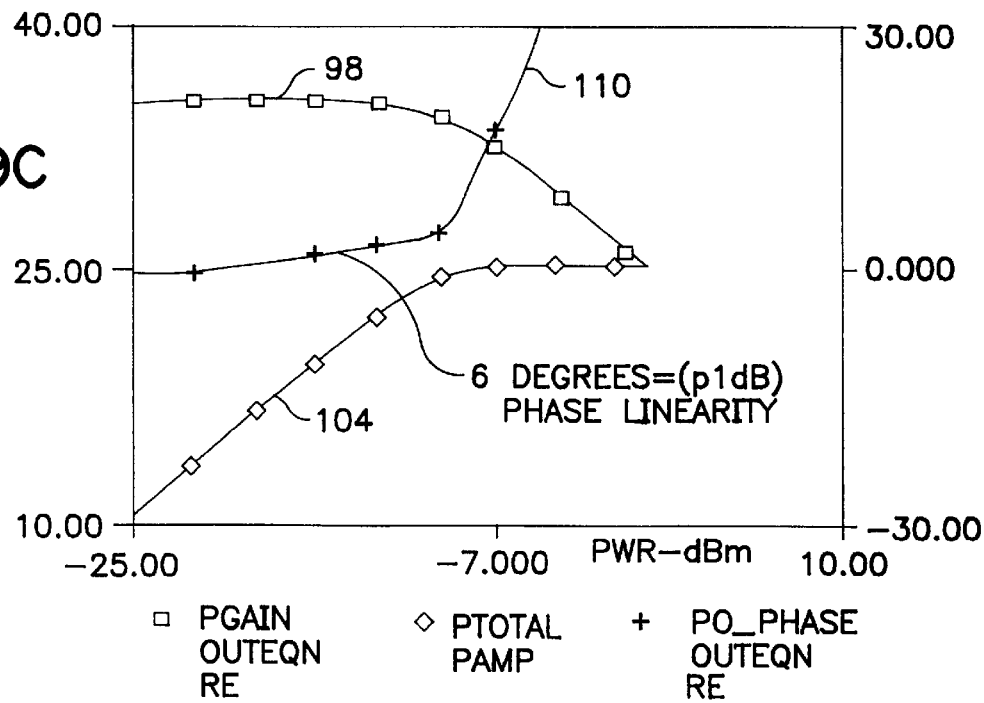
FIG. 9C is a graphical illustration of the gain, output power $P_{OUT}$, and normalized insertion phase as a function of the input power $P_{IN}$ for the circuit illustrated in FIG. 9A.
Figure 10A:
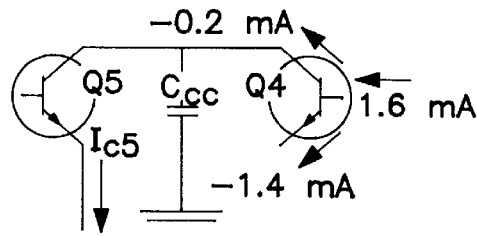
FIG. 10A is similar to FIG. 9A, but for a medium tuning voltage $V_{afb}$.
Figure 10B:
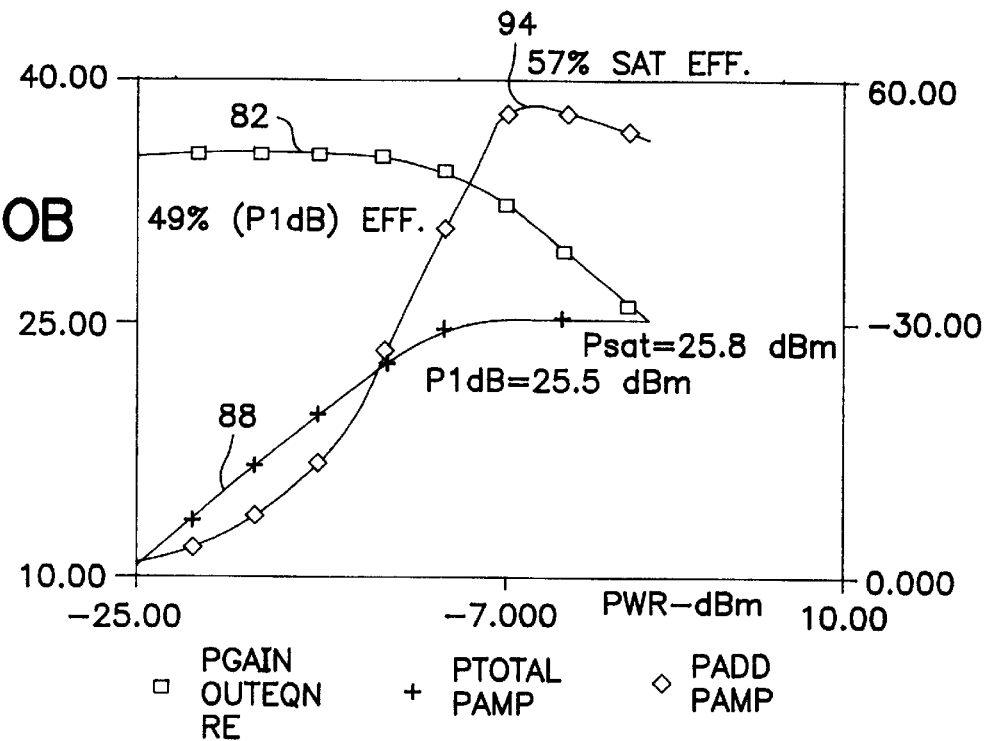
FIG. 10B is a graphical illustration of the gain, output power $P_{OUT}$ and power-added efficiency (PAE) as a function of the input power $P_{IN}$ for the circuit illustrated in FIG. 10A.
Figure 10C:
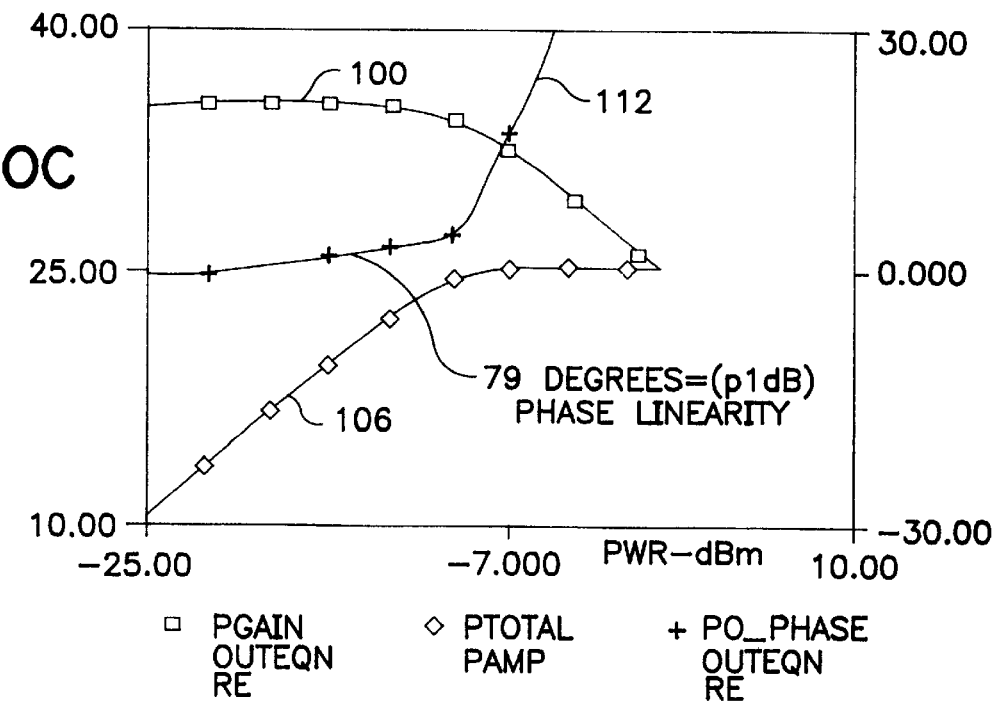
FIG. 10C is a graphical illustration of the gain, output power $P_{OUT}$ and normalized insertion phase as a function of the input power $P_{IN}$ for the circuit illustrated in FIG. 10A.
Figure 11A:
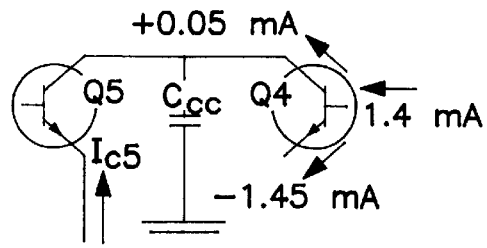
FIG. 11A is a simplified schematic diagram of the pre-distortion driver circuit of FIG. 8 for a relatively low tuning voltage $V_{afb}$.
Figure 11B:
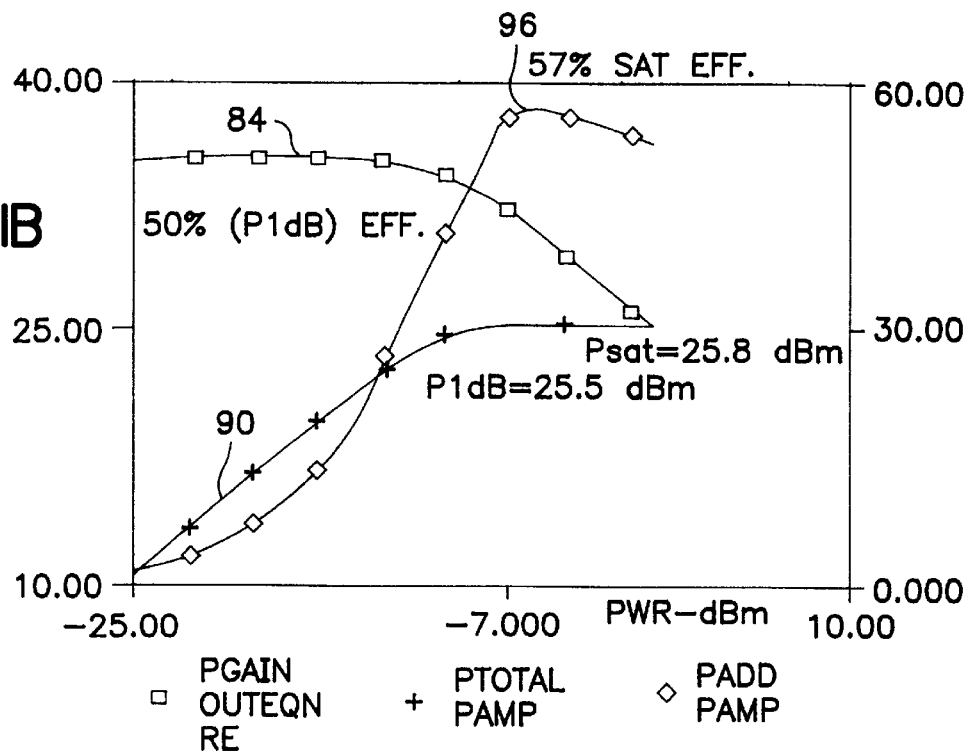
FIG. 11B is a graphical illustration of the gain, output power $P_{OUT}$ and power-added efficiency (PAE) as a function of the input power $P_{IN}$ for the circuit illustrated in FIG. 11A.
Figure 11C:
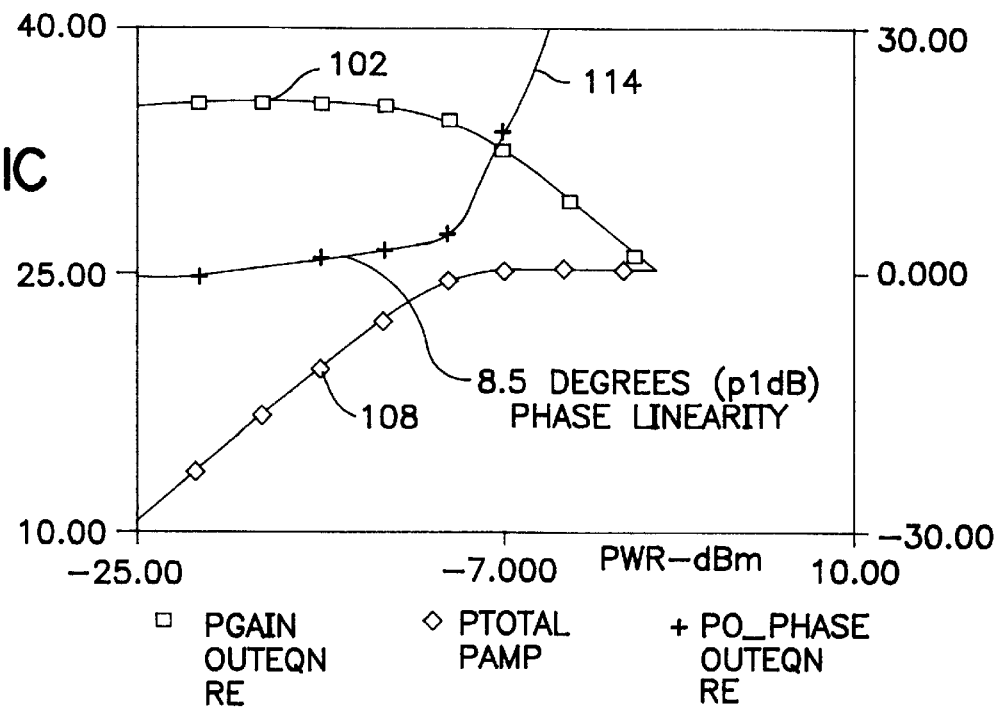
FIG. 11C is a graphical illustration of the gain, output power $P_{OUT}$, as well as the normalized insertion phase as a function of the input power $P_{IN}$ for the circuit illustrated in FIG. 11A.

The effect of the active feedback bias tuning circuit 78 on the overall performance of the two-stage linearized power amplifier 20 is illustrated in FIGS. 9, 10 and 11. In particular, these FIGS. 9, 10 and 11 illustrate the performance of a two-stage linearized power amplifier 20 in which the pre-distortion active feedback driver amplifier 22 incorporates an active feedback bias tuning circuit 78, as illustrated in FIG. 8, for a relatively high, medium and low value of the active feedback bias voltage $V_{afb}$. FIGS. 9A, 10A and 11A illustrate the effect of a high, medium and low active feedback bias voltage $V_{afb}$ on the feedback transistor $Q_4$. FIGS. 9B, 10B and 11B represent the gain, output power $P_{out}$ and power-added efficiency (PAE) of the two-staged linearized power amplifier 20, incorporating the active feedback bias tuning circuit 78 as a function of the input power $P_{in}$. The curves 80, 82 and 84 (FIGS. 9B, 10B and 11B) represent the gain, while the curves 86, 88 and 90 represent the output power, and the curves 92, 94 and 96 represent the power-added efficiency (PAE) of the two-stage linearized power amplifier 20, which incorporates the active feedback bias tuning circuit 78 as a function of the input power $P_{in}$, for a high, medium and low value active feedback bias voltage $V_{afb}$. FIGS. 9C, 10C and 11C illustrate the gain, output power $P_{out}$, as well as insertion phase of the two-stage linearized power amplifier 20 incorporating an active feedback bias tuning circuit 78 as a function of the input power $P_{in}$, for a high, medium and low value active feedback bias voltage $V_{afb}$, respectively. The curves 98, 100 and 102 represent the gain, and are similar to the curves 80, 82 and 84, respectively, illustrated in FIGS. 9B, 10B and 11B. The curves 104, 106 and 108 (FIGS. 9C, 10C, 11C) represent the output power $P_{out}$ and are similar to the curves 86, 88 and 90, respectively, illustrated in FIGS. 9B, 10B and 11B. The curves 110, 112 and 114 illustrate the insertion phase of the two-stage linearized power amplifier 20 which incorporates the active feedback bias tuning circuit 78 as a function of input power $P_{in}$, for a relatively high, medium and low value of the active feedback bias voltage $V_{afb}$.

Referring to FIGS. 9 through 11, as the active feedback bias voltage $V_{afb}$ is decreased, the dc bias of the feedback transistor $Q_4$ is gradually moved out of deep saturation, as illustrated by the biasing current values and vectors illustrated in FIGS. 9A, 10A and 11A. As the feedback transistor $Q_4$ moves out of saturation, the power-added efficiency (PAE) increases only slightly from 48 percent (curve 92) to 50 percent (curve 96) at the 1 dB compression point $P_{1dB}$. However, curves 110, 112 and 114 indicate that the insertion phase degrades from only 6° to 8.5° at the 1 dB compression point $P_{1dB}$ as the active tuning voltage $V_{afb}$ is decreased.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A two-stage linearized power amplifier comprising:
   a power amplifier having an input terminal and an output terminal, said power amplifier having a gain characteristic which decreases as a function of increasing power applied to its input terminal; and a pre-distortion driver amplifier circuit having an input terminal and an output terminal, said output terminal of said driver amplifier being connected to said input terminal of said power amplifier forming a two-stage power amplifier, said predistortion driver amplifier circuit having a power transistor with a base, emitter and collector, said base electrically coupled to said input terminal of said predistortion driver amplifier circuit for receiving an RF input signal $RF_{in}$ and said collector electrically coupled to said output terminal of said predistortion driver amplifier circuit, said driver amplifier having a gain characteristic which increases as a function of the power applied to its input terminal in order to compensate for said power amplifier, said driver amplifier circuit including a first feedback loop which includes an active feedback transistor having a base, collector and emitter.

2. A two-stage linearized power amplifier circuit as recited in claim 1, wherein said active feedback transistor is operated substantially in its saturated bias point.

3. A two-stage linearized power amplifier circuit as recited in claim 1, wherein the base of said active feedback transistor is electrically coupled to the output of said driver amplifier.

4. A two-stage linearized power amplifier circuit as recited in claim 1, further including a second feedback loop for biasing said active feedback transistor.

5. A two-stage linearized power amplifier circuit as recited in claim 4, wherein said second feedback loop includes a biasing transistor having a base, collector and emitter.

6. A two-stage linearized power amplifier circuit as recited in claim 5, wherein said biasing transistor is operated substantially at or near its saturation point.

7. A two-stage linearized power amplifier circuit as recited in claim 5, wherein the collector of said active feedback transistor is electrically coupled to the collector of said biasing transistor.

8. A two-stage linearized power amplifier circuit as recited in claim 7, wherein the emitter of said active feedback transistor is electrically coupled to said input terminal of said driver amplifier.

9. A two-stage linearized power amplifier circuit as recited in claim 1, wherein the driver amplifier is configured with a characteristic of decreasing insertion phase with increasing input power.

10. A two-stage linearized power amplifier circuit as recited in claim 9, wherein the overall gain and insertion phase increase as a function of the input power for a predetermined output power.

11. A two-stage linearized power amplifier circuit as recited in claim 1, further including an active feedback biasing tuning circuit for enabling external electronic tuning of the bias of said active feedback transistor.

12. A two-stage linearized power amplifier circuit as recited in claim 5, further including an active feedback biasing transistor for enabling electronic tuning of the bias of said active feedback transistor.

13. A two-stage linearized power amplifier circuit as recited in claim 11, wherein said active feedback biasing circuit includes a voltage port for enabling an external voltage to be applied to said tuning circuit.

14. A two-stage linearized power amplifier circuit as recited in claim 12, wherein said active feedback biasing circuit includes a voltage port for enabling an external voltage to be applied to said tuning circuit.

15. A two-stage linearized power amplifier circuit comprising:

a power amplifier circuit having an input terminal and an output terminal, said power amplifier circuit having a gain characteristic which decreases as a function of increasing input power and having an insertion phase characteristic which increases as a function of increasing input power; and a driver amplifier circuit having an input terminal for receiving an RF input signal and an output terminal, said output terminal electrically coupled to said input terminal of said power amplifier circuit forming a two-stage power amplifier circuit, said driver amplifier having a gain characteristic which increases as a function of the input power and having an insertion phase characteristic which decreases as a function of the input power, said driver amplifier circuit including a first feedback loop which includes an active feedback transistor having a base, collector and emitter.

16. A two-stage linearized power amplifier circuit comprising:

a power amplifier circuit having an input terminal and an output terminal, said power amplifier circuit having an insertion phase characteristic which increases as a function of increasing input power; and a driver amplifier circuit having an input terminal for receiving an RF input signal and an output terminal, said output terminal electrically coupled to said input terminal of said power amplifier circuit forming a two-stage power amplifier circuit, said driver amplifier having an insertion phase characteristic which decreases as a function of the input power, said driver amplifier circuit including a first feedback loop which includes an active feedback transistor having a base, collector and emitter.

17. A two-stage linearized power amplifier circuit comprising:

a power amplifier circuit having an input terminal and an output terminal, said power amplifier circuit having a predetermined characteristic which changes as a predetermined function of the input power applied to said input terminal; and a driver amplifier circuit having an input terminal for receiving an RF input signal and an output terminal, said output terminal electrically coupled to said input terminal of said power amplifier forming a two-stage power amplifier circuit, said driver amplifier circuit having pre-distortion characteristics to compensate for said predetermined characteristics of said power amplifier, said driver amplifier circuit including a first feedback loop which includes an active feedback transistor having a base, collector and emitter.

18. A two-stage linearized power amplifier circuit as recited in claim 17, wherein said predetermined characteristic is gain.

19. A two-stage linearized power amplifier circuit as recited in claim 18, wherein said power amplifier has a decreasing gain characteristic as a function of increasing input power for a predetermined output power.

20. A two-stage linearized power amplifier circuit as recited in claim 19, wherein said driver amplifier circuit has an increasing gain characteristic as a function of increasing input power for a predetermined output power.

21. A two-stage linearized power amplifier circuit as recited in claim 18, wherein said predetermined characteristic is insertion phase.

22. A two-stage linearized power amplifier circuit as recited in claim 19, wherein said power amplifier has an increasing insertion phase characteristic as a function of increasing input power.

23. A two-stage linearized power amplifier circuit as recited in claim 20, wherein said driver amplifier circuit has a decreasing insertion phase characteristic as a function of increasing input power.

24. A two-stage linearized power amplifier circuit as recited in claim 17, wherein said driver amplifier circuit includes a power transistor and a first feedback loop for biasing said power transistor.

25. A two-stage linearized power amplifier circuit as recited in claim 24, wherein said first feedback loop includes an active feedback transistor.

26. A two-stage linearized power amplifier circuit as recited in claim 25, further including a second feedback loop for biasing said feedback transistor.

27. A two-stage linearized power amplifier circuit as recited in claim 26, wherein said second feedback loop includes a biasing transistor for biasing said feedback transistor.

28. A two-stage linearized power amplifier circuit as recited in claim 27, wherein said feedback transistor is operated substantially at its saturation point.

29. A two-stage linearized power amplifier circuit as recited in claim 28, wherein said biasing transistor is operated substantially at its saturation point.

30. A two-stage linearized power amplifier circuit as recited in claim 26, further including a tuning circuit for enabling the bias level of said second feedback loop to be adjusted electronically.

31. A two-stage linearized power amplifier circuit as recited in claim 30, wherein said tuning circuit includes a port for connection to an external voltage source.

32. A two-stage linearized power amplifier circuit as recited in claim 28, wherein said biasing transistor has a collector which is directly coupled to the collector of said feedback transistor.

* * * * *